United States Patent
Ng et al.

(10) Patent No.: US 8,390,042 B2
(45) Date of Patent: Mar. 5, 2013

(54) GATE ETCH OPTIMIZATION THROUGH SILICON DOPANT PROFILE CHANGE

(75) Inventors: Man Fai Ng, Poughkeepsie, NY (US); Rohit Pal, Fishkill, NY (US)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 13/353,013

(22) Filed: Jan. 18, 2012

(65) Prior Publication Data

US 2012/0119308 A1    May 17, 2012

Related U.S. Application Data

(62) Division of application No. 12/469,418, filed on May 20, 2009, now Pat. No. 8,124,515.

(51) Int. Cl.
*H01L 29/43* (2006.01)
*H01L 29/78* (2006.01)

(52) U.S. Cl. .................. 257/288; 257/754; 257/E29.16; 257/E29.159; 257/E29.154

(58) Field of Classification Search .................. 438/592; 257/288, 410, E29.128, E29.132, E29.155, 257/E29.158, E29.159, E29.16
See application file for complete search history.

(56) References Cited

U.S. PATENT DOCUMENTS

| | | | |
|---|---|---|---|
| 5,783,478 A | 7/1998 | Chau et al. | |
| 5,923,999 A | 7/1999 | Balasubramanyam et al. | |
| 6,162,711 A * | 12/2000 | Ma et al. | 438/558 |
| 6,174,807 B1 | 1/2001 | Kizilyalli et al. | |
| 6,406,952 B2 | 6/2002 | Bevk | |
| 6,458,641 B2 | 10/2002 | Tsukamoto | |
| 6,465,335 B1 | 10/2002 | Kunikiyo | |
| 6,555,879 B1 * | 4/2003 | Krivokapic et al. | 257/382 |
| 6,696,345 B2 | 2/2004 | Chau et al. | |
| 6,730,584 B2 * | 5/2004 | Schuegraf et al. | 438/549 |
| 6,855,641 B2 * | 2/2005 | Ryu et al. | 438/767 |
| 6,939,787 B2 | 9/2005 | Ohtake et al. | |
| 7,018,887 B1 | 3/2006 | Pan | |
| 7,060,571 B1 | 6/2006 | Ngo et al. | |
| 7,071,086 B2 | 7/2006 | Woo et al. | |
| 7,078,278 B2 | 7/2006 | Pan et al. | |
| 7,081,656 B2 * | 7/2006 | Eppich et al. | 257/392 |
| 7,385,249 B2 * | 6/2008 | Yang | 257/331 |
| 8,124,515 B2 * | 2/2012 | Ng et al. | 438/592 |
| 2002/0102848 A1 | 8/2002 | Xiang et al. | |
| 2004/0106261 A1 | 6/2004 | Huotari et al. | |
| 2004/0175910 A1 | 9/2004 | Pan et al. | |
| 2004/0214416 A1 | 10/2004 | Woo et al. | |
| 2004/0222443 A1 | 11/2004 | Rotondaro et al. | |
| 2005/0059198 A1 * | 3/2005 | Visokay et al. | 438/199 |
| 2005/0136605 A1 | 6/2005 | Murto et al. | |
| 2006/0017112 A1 * | 1/2006 | Wang et al. | 257/369 |
| 2008/0149990 A1 | 6/2008 | Wang et al. | |
| 2008/0220579 A1 | 9/2008 | Pal et al. | |
| 2008/0299754 A1 | 12/2008 | Yu et al. | |

(Continued)

FOREIGN PATENT DOCUMENTS

EP    0 287 031 A2 * 10/1988

*Primary Examiner* — Mary Wilczewski
(74) *Attorney, Agent, or Firm* — Ditthavong Mori & Steiner, P.C.

(57) ABSTRACT

Improved semiconductor devices including metal gate electrodes are formed with reduced performance variability by reducing the initial high dopant concentration at the top portion of the silicon layer overlying the metal layer. Embodiments include reducing the dopant concentration in the upper portion of the silicon layer, by implanting a counter-dopant into the upper portion of the silicon layer, removing the high dopant concentration portion and replacing it with undoped or lightly doped silicon, and applying a gettering agent to the upper surface of the silicon layer to form a thin layer with the gettered dopant, which layer can be removed or retained.

8 Claims, 15 Drawing Sheets

U.S. PATENT DOCUMENTS

| | | |
|---|---|---|
| 2008/0308876 A1* | 12/2008 | Lee et al. .................. 257/369 |
| 2009/0186455 A1 | 7/2009 | Bedell et al. |
| 2009/0221116 A1 | 9/2009 | Hase |
| 2009/0275179 A1 | 11/2009 | Basker et al. |
| 2010/0295103 A1 | 11/2010 | Ng et al. |
| 2010/0317180 A1 | 12/2010 | Rough et al. |
| 2011/0186934 A1 | 8/2011 | Chen et al. |

* cited by examiner

GATE ETCH OPTIMIZATION THROUGH SILICON DOPANT PROFILE CHANGE

TECHNICAL FIELD

The present disclosure relates to a method of fabricating semiconductor devices with improved metal gate electrodes, and to the resulting devices. The present disclosure is particularly applicable in fabricating metal gate transistors with improved device performance and reduced defects during encapsulation by reducing non-uniformity in dopant concentration of the gate electrode.

BACKGROUND

A typical metal gate electrode stack comprises an amorphous silicon or polycrystalline silicon capping layer 101, a metal layer 103, and a high K dielectric layer 105, over a semiconductor substrate 107, as illustrated in FIG. 1. For P-type semiconductor devices with metal gate electrodes, the amorphous silicon or polycrystalline silicon layer is typically doped, for example with an appropriate dopant, such as boron (B), aluminum, or gallium, notably B, to improve device performance and control conductivity. However, it was found that during doping, as by ion implantation, a high dopant concentration is formed at the upper surface of the silicon layer which decreases asymptotically downward from the surface leaving a non-uniform dopant concentration profile. The resulting high dopant concentration region 201 near the top surface of silicon layer 101, etches at a rate different from the remainder of silicon layer 101. For example B-doped silicon has a slower etch rate than undoped silicon, and the etch rate changes monotonously with dopant concentration. Accordingly and adverting to FIG. 2, upon etching the layers after dopant implantation, the high B concentration region 201 etches at a significantly lower rate that the remainder of silicon layer 101, resulting in a gate stack having non-linear side surfaces due to undercutting 203, and forming a "shoulder" 205 near the top of the patterned gate. The "shoulder" will not only cause variability in device performance, but also acts as a weak point in subsequent encapsulation, thereby leading to defects.

A need therefore exists for methodology enabling the fabrication of semiconductor devices with metal gate transistors, particularly P-type metal gate transistors, having reduced variability in device performance.

SUMMARY

An aspect of the present disclosure is an efficient method of fabricating a semiconductor device comprising a metal gate transistor with reduced variability in device performance.

Another aspect of the present disclosure is semiconductor device comprising a metal gate transistor with reduced variability in device performance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming a metal layer; forming a silicon layer, having an upper surface and a lower surface, on the metal layer; introducing a dopant into the silicon layer, wherein the high dopant concentration region has a dopant concentration greater than that of the remainder of the silicon layer; and reducing the dopant concentration of the high dopant concentration region.

Aspects of the present disclosure include forming a P-type transistor and implanting boron (B) as the dopant. Another aspect includes reducing the dopant concentration by introducing a counter-dopant into the high dopant concentration region. A further aspect includes ion implanting boron (B) as the dopant, and ion implanting phosphorus as the counter-dopant. An additional aspect includes reducing the dopant concentration by removing the high dopant concentration region and forming a regrown silicon layer on the silicon layer. A further aspect includes lightly doping the regrown silicon such that the dopant concentration of the regrown silicon layer is no greater than that of the silicon layer. Another aspect includes removing the silicon by chemical mechanical planarization, wet etching, or reactive ion etching. A further aspect includes reducing the dopant concentration by applying a gettering agent to the upper surface of the silicon layer, and forming a gettered dopant layer on the upper surface of the silicon layer. Another aspect includes applying a fluorine—containing oxide as the gettering agent. Another aspect includes removing the gettered dopant layer by chemical mechanical planarization, wet etching, or reactive ion etching. An additional aspect includes forming the metal layer on a high-K dielectric layer, and etching the silicon layer, metal layer, and high-K dielectric layer to form a metal gate stack having substantially aligned side surfaces.

Another aspect of the present disclosure is a semiconductor device having a metal gate transistor comprising: a metal layer; a silicon layer, having an upper and a lower surface, on the metal layer, the silicon layer containing a dopant having a substantially uniform dopant concentration between the upper surface and the lower surface.

Aspects include devices wherein the metal layer is on a high-K dielectric layer. A further aspect includes transistors comprising a metal gate stack of a silicon layer, metal layer, and high-K dielectric layer with side surfaces that are substantially aligned. Another aspect includes metal gates with a regrown silicon layer over the silicon layer, the regrown silicon layer having a thickness less than a thickness of the silicon layer, such as a thickness of about 10 to about 15 nm, wherein the combined thickness of the regrown silicon layer and the silicon layer is about 55 nm to about 65 nm, and the regrown silicon layer having a dopant concentration no greater than that of the silicon layer. Another aspect includes a metal gate with a region of the upper surface of the silicon layer containing a counter-dopant to the dopant in the silicon layer. A further aspect includes a metal gate with a gettered dopant layer on the upper surface of the silicon layer.

Another aspect of the present disclosure is a method of fabricating a semiconductor device having a P-type metal gate transistor, the method comprising: depositing a metal layer on a high-K dielectric layer; forming a silicon layer, having an upper surface and a lower surface, on the metal layer; ion implanting boron into the silicon layer, wherein a region of the upper surface contains boron at a concentration greater than a concentration of boron in the silicon layer; reducing the boron concentration in the region; and etching the silicon layer, metal layer, and high-K dielectric layer to form a metal gate stack having substantially uniform side surfaces; the method comprising reducing the boron concentration by: (a) introducing a phosphorus counter-dopant into the region; (b) removing the region, forming a regrown silicon layer on the silicon layer, and introducing boron into the regrown silicon layer at a concentration not greater than the boron concentration in the silicon layer; or (c) applying a gettering agent to the upper surface of the silicon layer, and forming a gettered dopant layer on the upper surface of the silicon layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
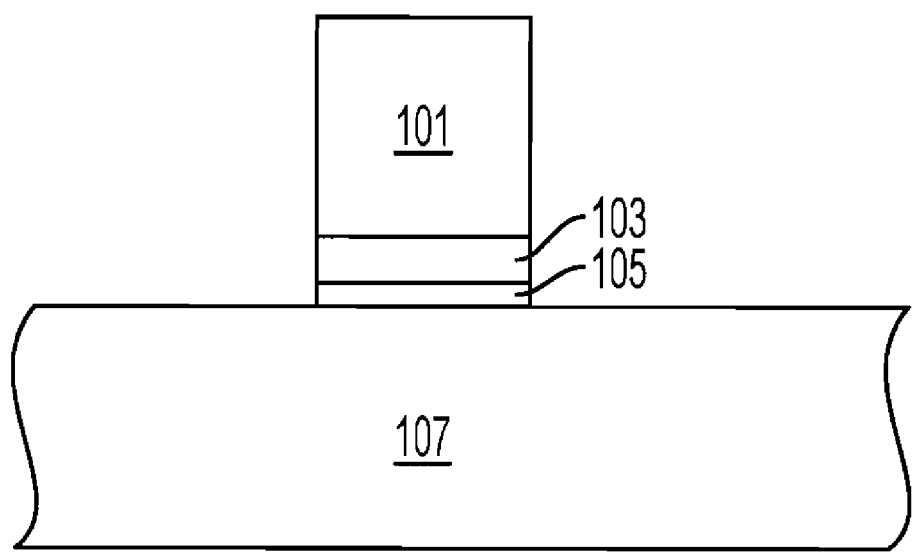
FIG. 1 schematically illustrates a prior art metal gate electrode structure.
Figure 2:
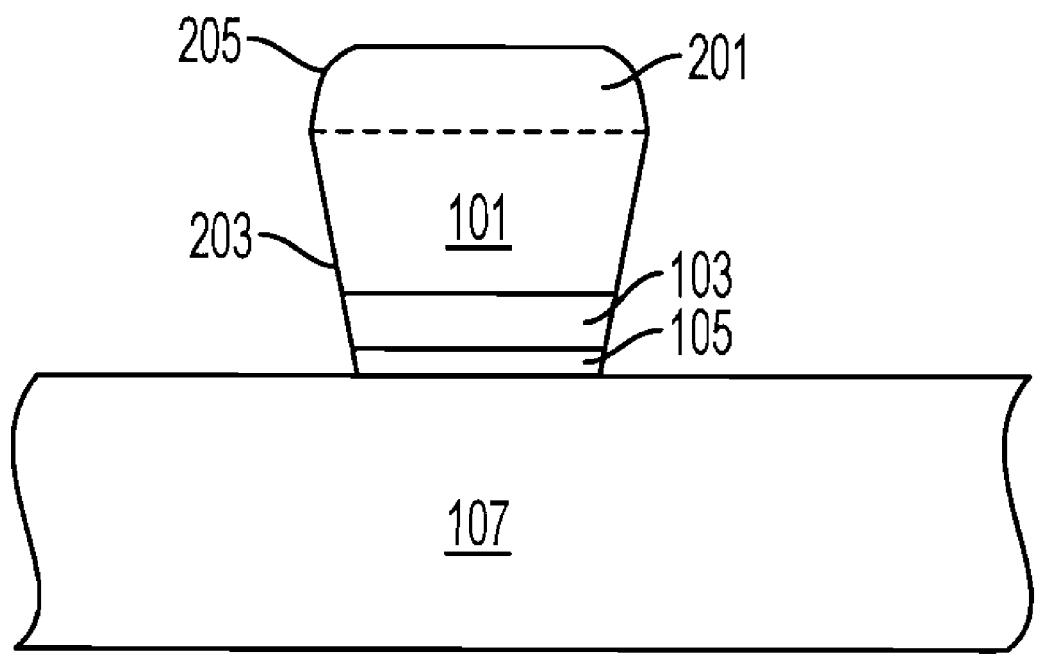
FIG. 2 schematically illustrates undercutting during etching a prior art metal gate stack.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the variation in device performance problem caused by undercutting due to a non-uniform dopant concentration in the silicon layer, i.e., a high dopant concentration region in the upper surface of the silicon layer, typically encountered when forming P-type transistors. In accordance with embodiments of the present disclosure, the dopant concentration in the high dopant concentration region at the upper surface of the silicon portion of a metal gate electrode is reduced. As a consequence of the reduction in dopant, the gate electrode can be etched to form a gate stack with substantially uniform side surfaces, thereby reducing variability in device performance and reducing defects during subsequent encapsulation.

Conventional practices include forming a metal layer, forming a silicon layer, having an upper surface and a lower surface, on the metal layer, introducing a dopant into the silicon layer, which undesirably results in a high dopant concentration region at the upper surface of the silicon layer, wherein the high dopant concentration region has a dopant concentration greater than that of the remainder of the silicon layer, typically about three to four orders of magnitude greater. Embodiments of the present disclosure include reducing the dopant concentration of the high dopant concentration region. Embodiments include reducing the dopant concentration by introducing a counter-dopant into the high dopant concentration region, e.g., introducing phosphorus as a counter-dopant to B, as by ion implantation. In another embodiment, the high dopant concentration region is removed, as by chemical mechanical planarization, wet etching, or reactive ion etching, and a regrown silicon layer is formed on the silicon layer. Subsequently, the regrown silicon may be lightly doped such that the dopant concentration of the regrown silicon layer is no greater than that of the silicon layer. In another embodiment, the dopant concentration in the high dopant concentration region is reduced by applying a gettering agent, such as a fluorine containing silicon oxide, (or surface dopant of $BF_3$), to the upper surface of the silicon layer, and forming a gettered dopant layer on the upper surface of the silicon layer. The gettered dopant layer may remain, as it is typically formed at a small thickness, e.g., about 10 Å to about 50 Å, or may be removed, as by chemical mechanical planarization, wet etching, or by reactive ion etching.

A semiconductor device in accordance with embodiments of the present disclosure includes a metal gate transistor having a metal layer, a silicon layer, having an upper and a lower surface, on the metal layer, the silicon layer containing a dopant, such as boron, having a substantially uniform concentration between the upper surface and the lower surface. The device transistor typically comprises a high-K dielectric layer, with the metal layer being on the high-K dielectric layer. As a result of reducing the dopant concentration of the high dopant concentration region, the gate stack after etching exhibits substantially uniformly aligned side surfaces, i.e., the side surfaces are substantially vertical, e.g., formed at an angle of 90° plus or minus 1°. The device may include a regrown silicon layer over the silicon layer, a counter-dopant to the dopant in the high dopant concentration region such that the concentration of the dopant is substantially uniform throughout the silicon layer, or a gettered dopant layer on the upper surface of the silicon layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 3A:
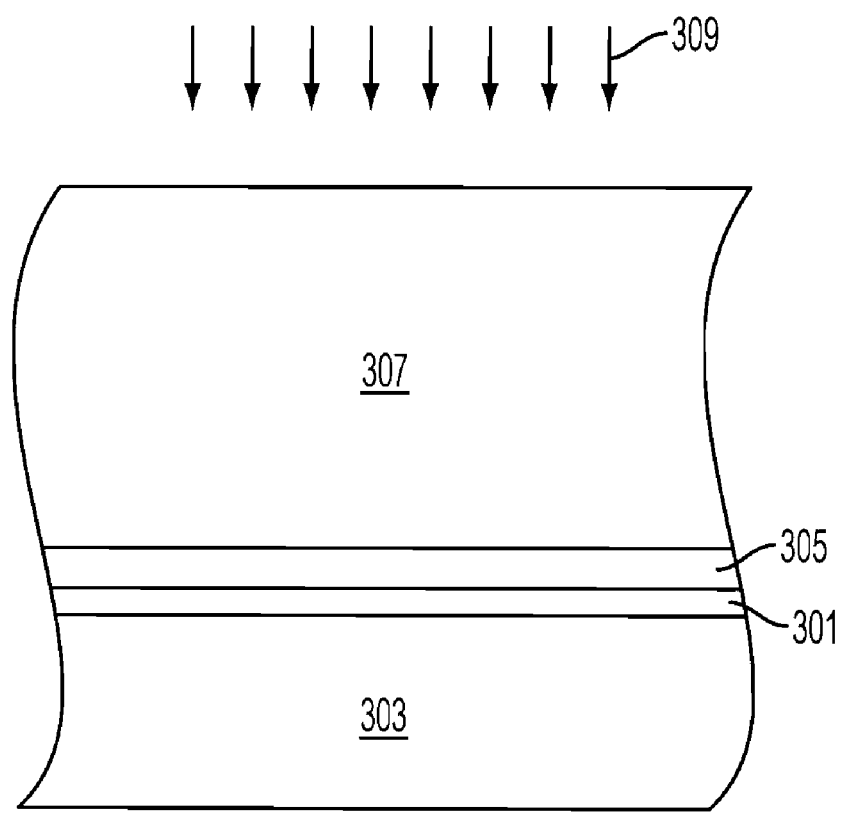
FIGS. 3A-3C schematically illustrate a process for forming a metal gate electrode, according to an exemplary embodiment.
Figure 3B:
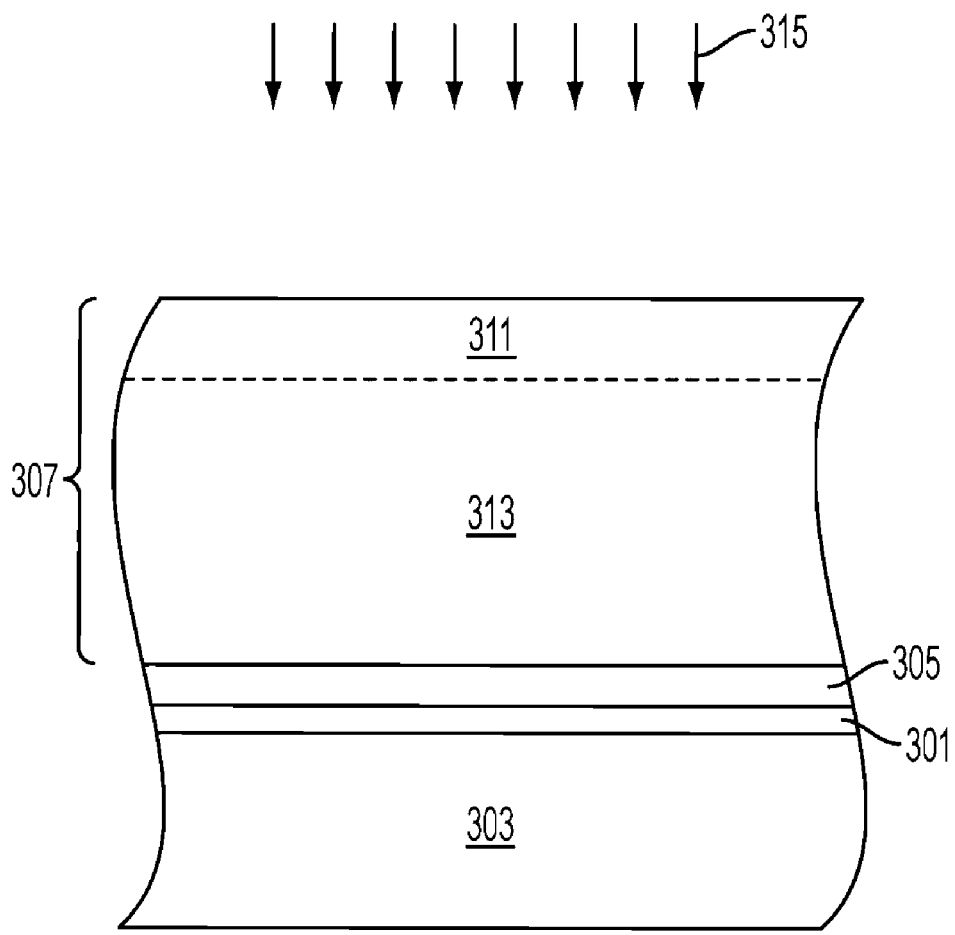
Figure 3C:
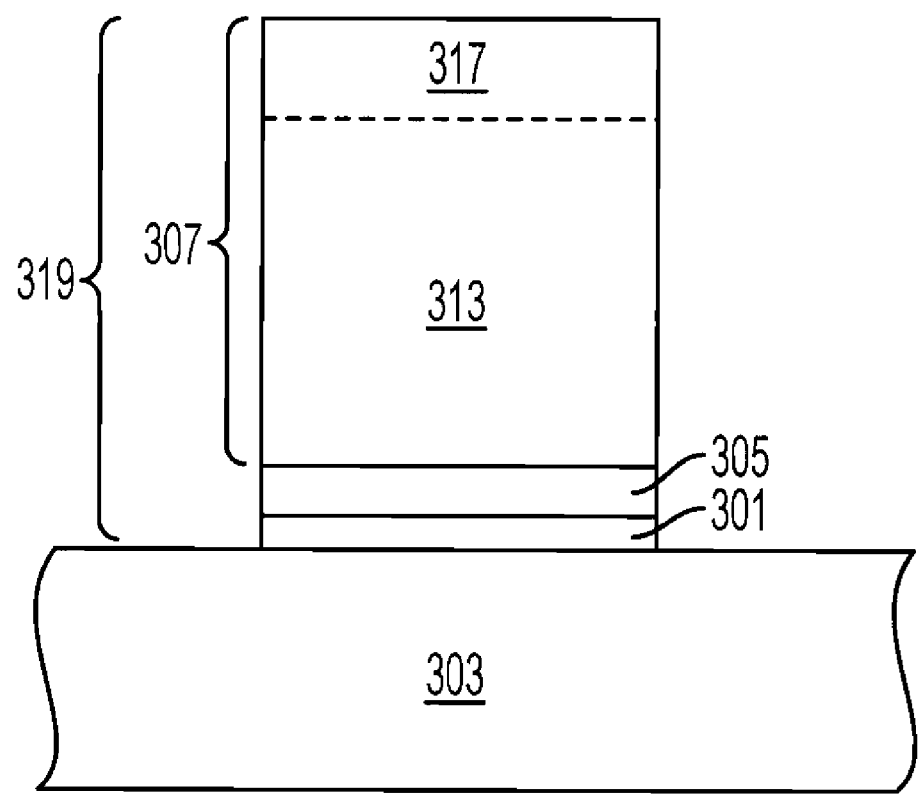

A process for forming a gate electrode in accordance with an embodiment of the present disclosure is illustrated in FIGS. 3A-3C, wherein like reference characters denote like features. As seen in FIG. 3A, a high-K dielectric layer 301 is formed on semiconductor substrate 303. A metal layer 305, such as titanium nitride (TiN) is formed over dielectric layer 301, with a thickness of, for example, about 2.5 to about 12, nanometers (nm). Polycrystalline silicon or amorphous silicon is then grown on metal layer 305 to form silicon layer 307. Silicon layer 307 has a thickness of about 55 nm to about 65 nm, e.g., about 60 nm. Ion implantation is then implemented as in a conventional manner to introduce a p-type halo dopant 309, e.g., B, $BF_3$, aluminum, or gallium, to silicon layer 307, typically at an energy of about 1 to about 8 keV and at a dosage of about 1E14 to about 8E16.

As the doping proceeds, a higher concentration of B, for example, builds up near the upper surface of silicon layer 307, dropping off exponentially from the top of silicon layer 307 to the bottom of silicon layer 307. As indicated in FIG. 3B, for example, when ion implanting B into a silicon layer 307 having a thickness of about 45 nm to about 65 nm, a high B concentration region 311 is formed at a thickness of about 10 to about 15 nm having a B concentration of about 1E21 to about 1E22 atoms/cm$^3$ compared to a B concentration of about 1E17 to about 1E18 atoms/cm$^3$ for the remainder of silicon layer 313. A counter-dopant 315, e.g., an n-type halo dopant, for example phosphorus, arsenic, or antimony, is introduced into the top portion 311 to neutralize B thereby equalizing the etch rate of regions 311 and 313. The counter-dopant may be introduced using a diffusion process or with low energy ion implantation, e.g., with an energy between about 0.01 keV and about 1 keV, and a dosage of about 1E12 to about 1E14. As shown in FIG. 3C, substantial equalization of the etch rate by ion implanting a counter dopant enables patterning the gate stack such that the side surfaces exhibit a substantially straight profile.

Another exemplary embodiment is illustrated in FIGS. 4A through 4D, wherein like reference characters denote like features. Adverting to FIG. 4A, a high-K dielectric layer 401 is formed on semiconductor substrate 403, metal layer 405 is formed over dielectric layer 401, as at a thickness of about 2.5 to about 12 nanometers (nm), and a silicon layer 407, i.e., polycrystalline silicon or amorphous silicon, is formed on metal layer 405 to form silicon layer 407, as at a thickness of about 55 nm to about 65 nm, e.g., about 60 nm. A dopant, e.g., B, is then introduced, as by ion implantation at an energy of about 1 keV to about 8 keV and at a dosage of about 1E14 to about 8E16. As the doping proceeds, a high B concentration region 411 is formed at the upper surface of silicon layer 407, similar to region 317 in FIG. 3C.

Figure 4A:
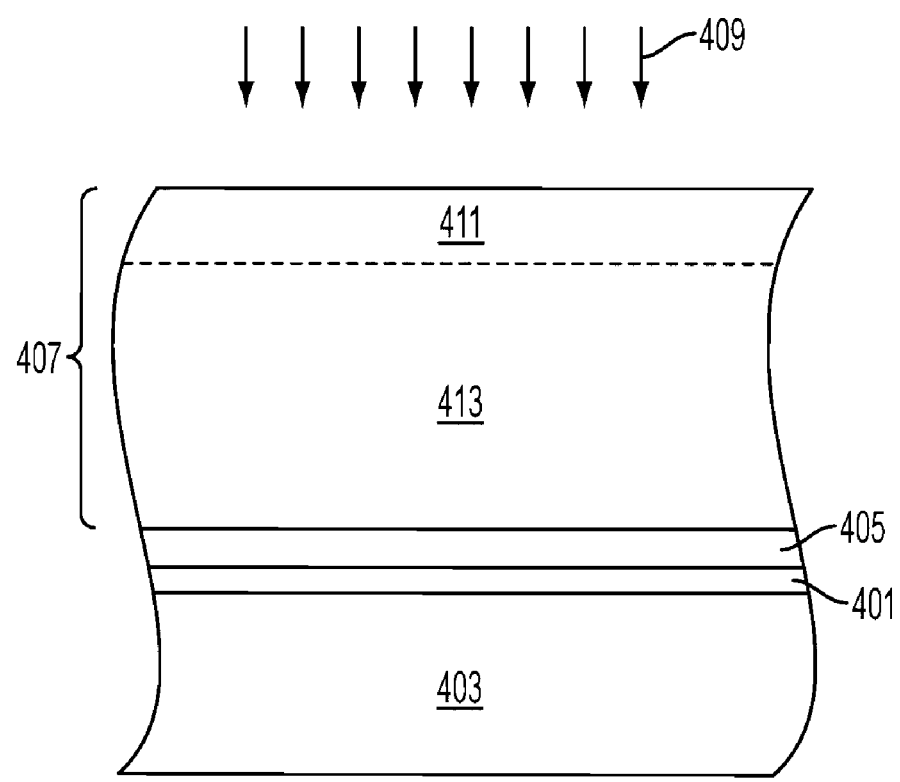
FIGS. 4A-4D schematically illustrate a process for forming a metal gate electrode, according to another exemplary embodiment.
Figure 4B:
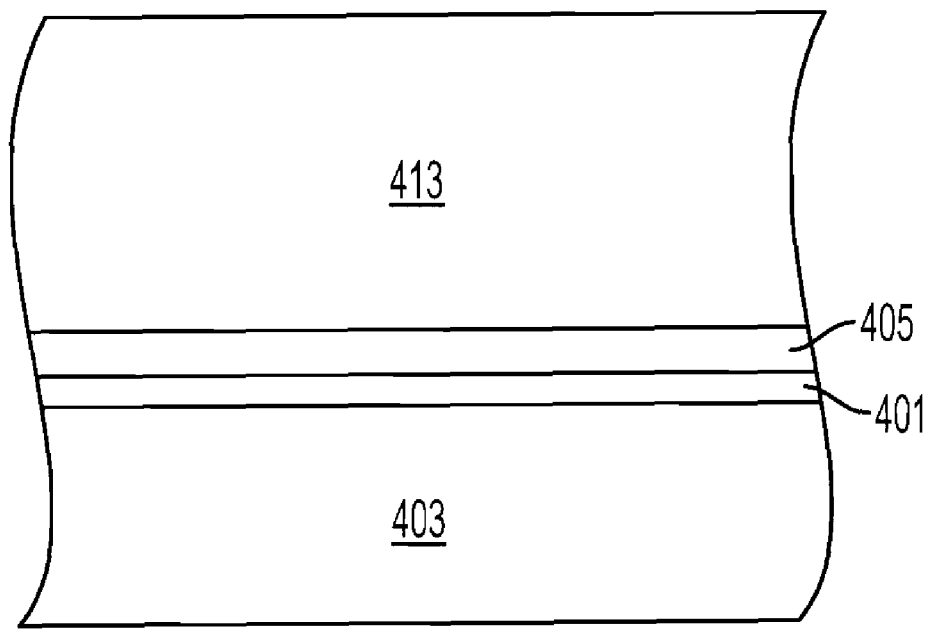
Figure 4C:
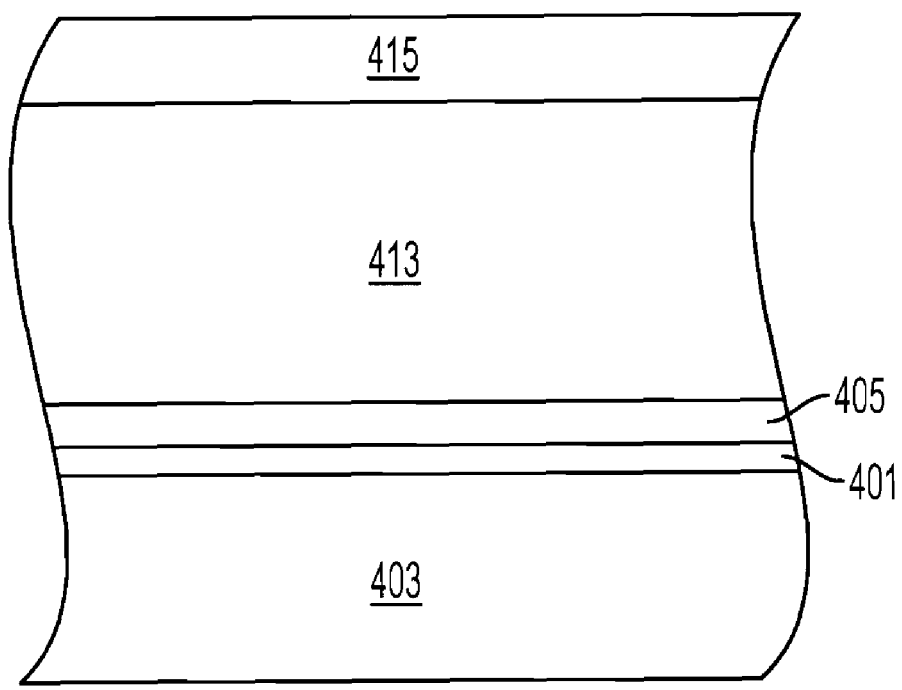

In accordance with this embodiment, high B concentration region 411, having a thickness of about 10 nm to about 15 nm, is removed, as by chemical mechanical planarization (CMP), wet etching, or reactive ion etching, resulting in the structure illustrated in FIG. 4B. A new layer of amorphous or polycrystalline silicon 415 is then be grown or deposited on remaining portion 413, as illustrated in FIG. 4C. Layer 415 may be left undoped or may be lightly doped with the same dopant. For example, B may be introduced by ion implantation at an energy of about 0.01 keV to about 1 keV and at a dosage of about 1E12 to about 1E14.

Figure 4D:
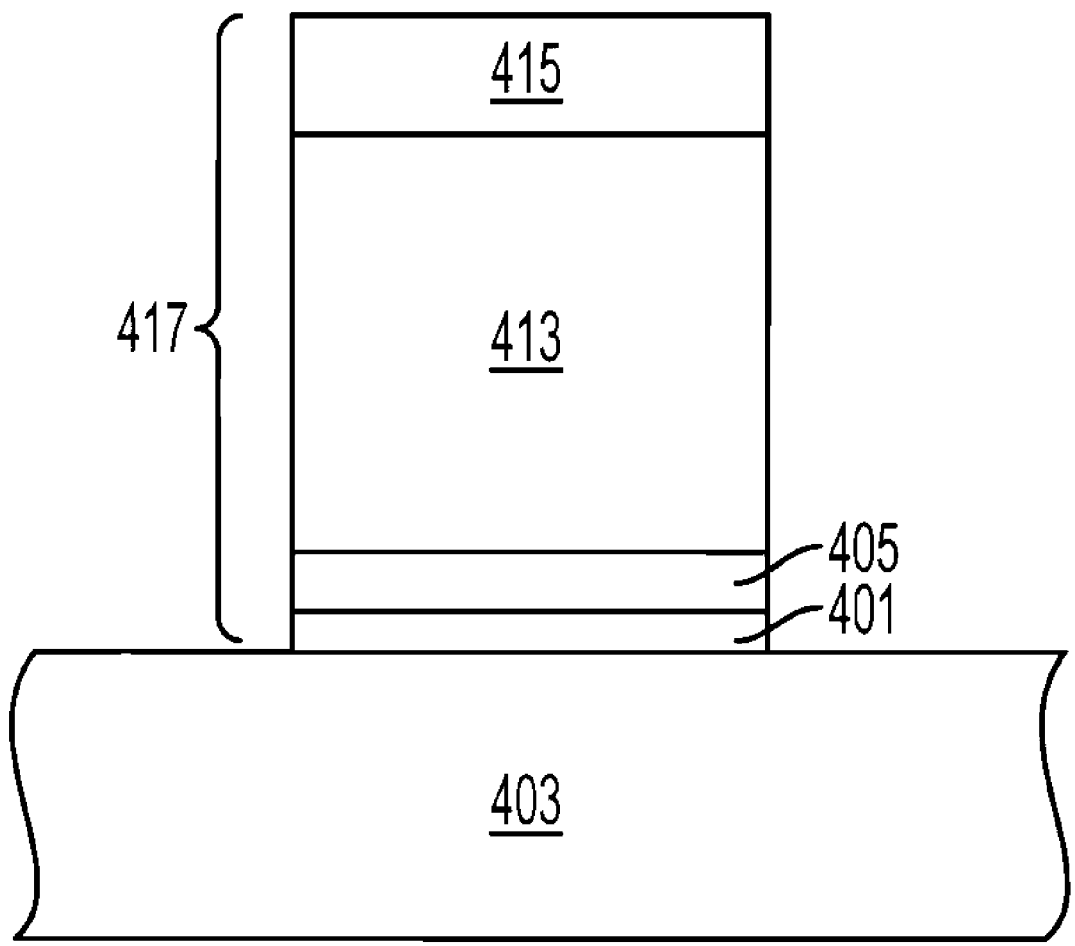

As shown in FIG. 4D, layers 401, 405, 413, and 415 are then etched to form gate stack 417, having a substantially straight edge profile as in FIG. 3C.

Figure 5A:
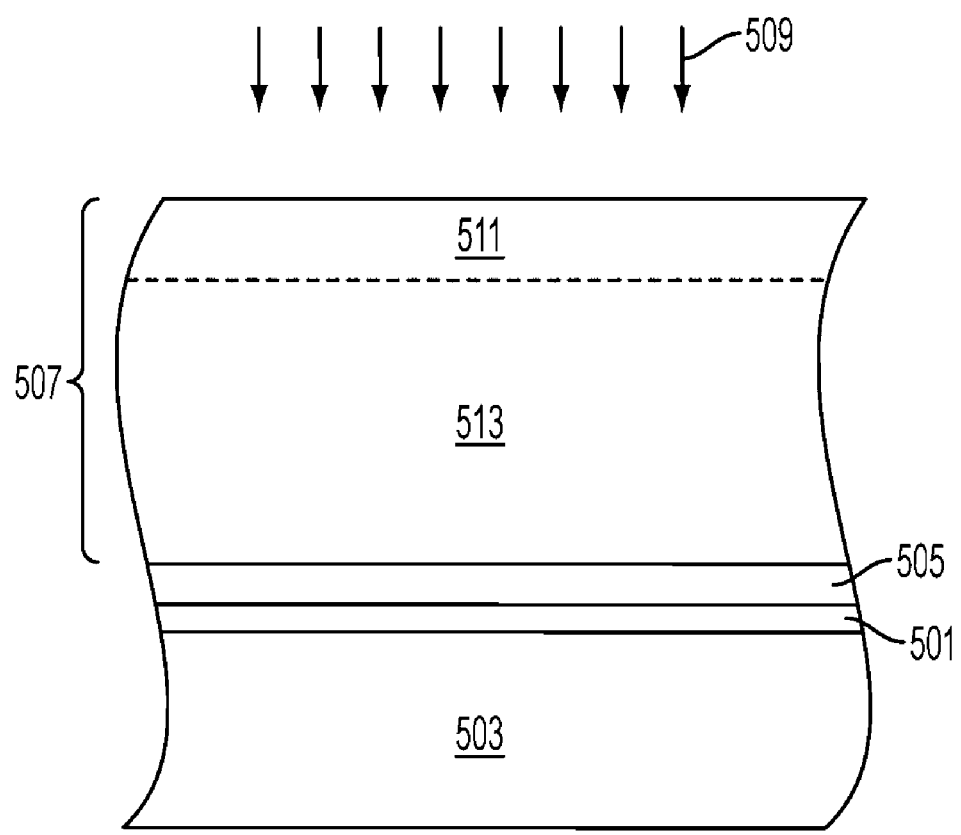
FIGS. 5A-5F schematically illustrate a process for forming a metal gate electrode, according to another exemplary embodiment.

FIGS. 5A-5F (wherein like reference characters denote like features) illustrate another exemplary embodiment of the present disclosure. As shown in FIG. 5A, a high-K dielectric layer 501 is formed on semiconductor substrate 503, metal layer 505 is formed over dielectric layer 501, and a silicon layer 507, i.e., polycrystalline silicon or amorphous silicon, is formed on metal layer 505, similar to that illustrated in FIGS. 3A and 4A. Similar to FIGS. 3A and 4A, a high concentration region 511 is formed near the upper surface of silicon layer 507.

Figure 5B:
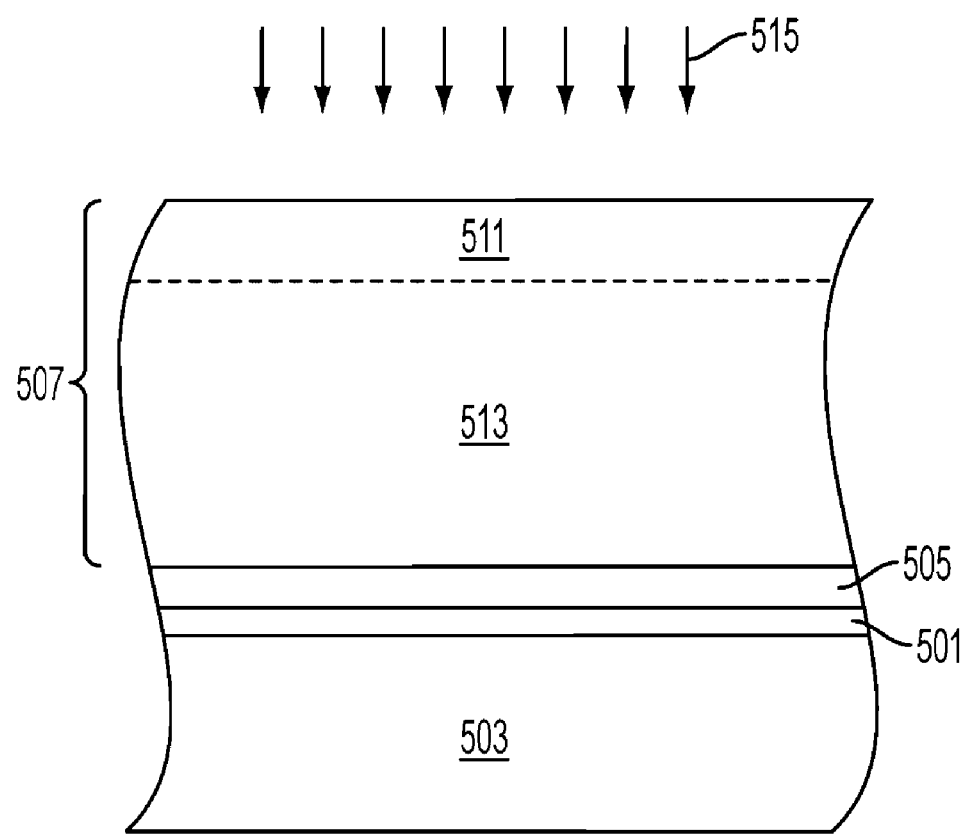
Figure 5C:
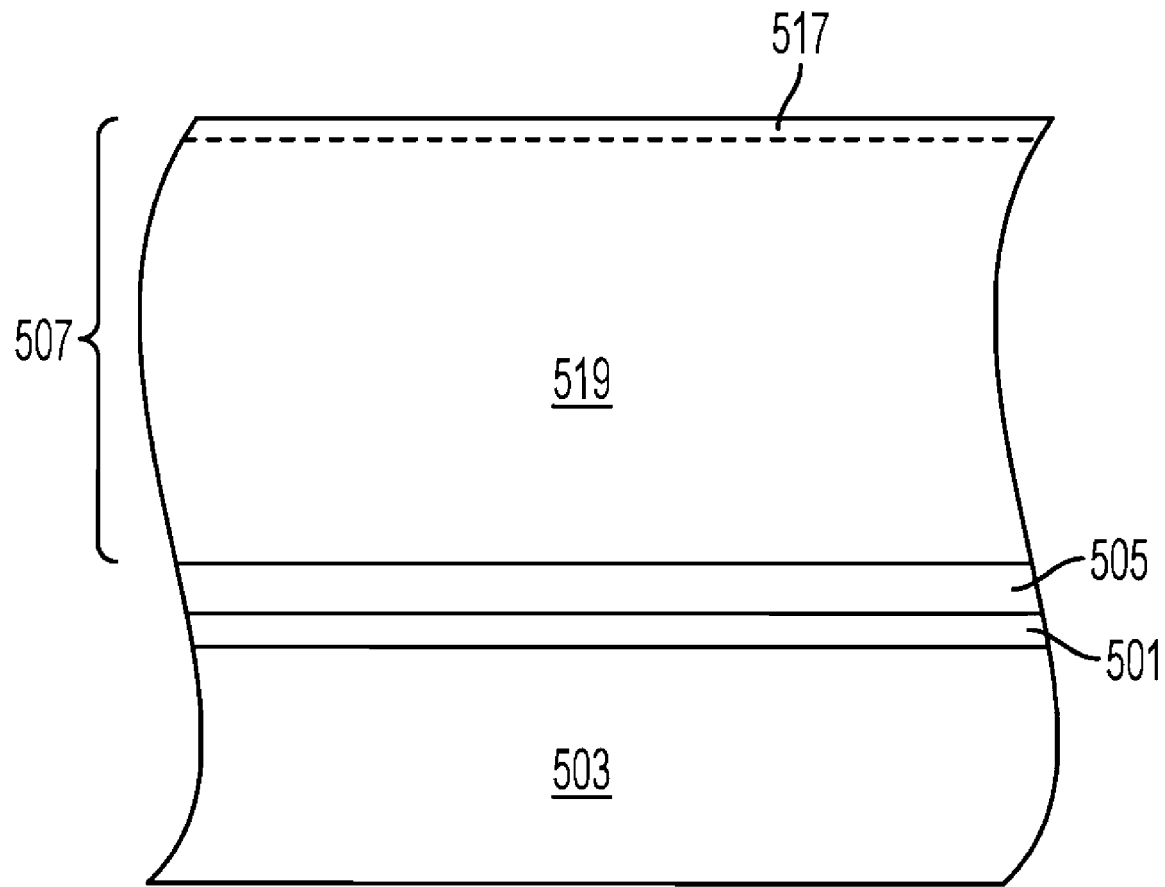

Adverting to FIG. 5B, in this embodiment a gettering agent 515, such as a fluorine containing oxide, e.g. SiOFx. is applied to the top surface of silicon layer 507. The gettering agent 515 extracts the B dopant to the top surface forming a very thin skin 517, as at a thickness of about 5 Å to about 10 Å, as shown in FIG. 5C, leaving the remainder 519 of silicon layer 507 with a relatively uniform B concentration. Gettering may be implemented or accelerated by thermal annealing.

Figure 5D:
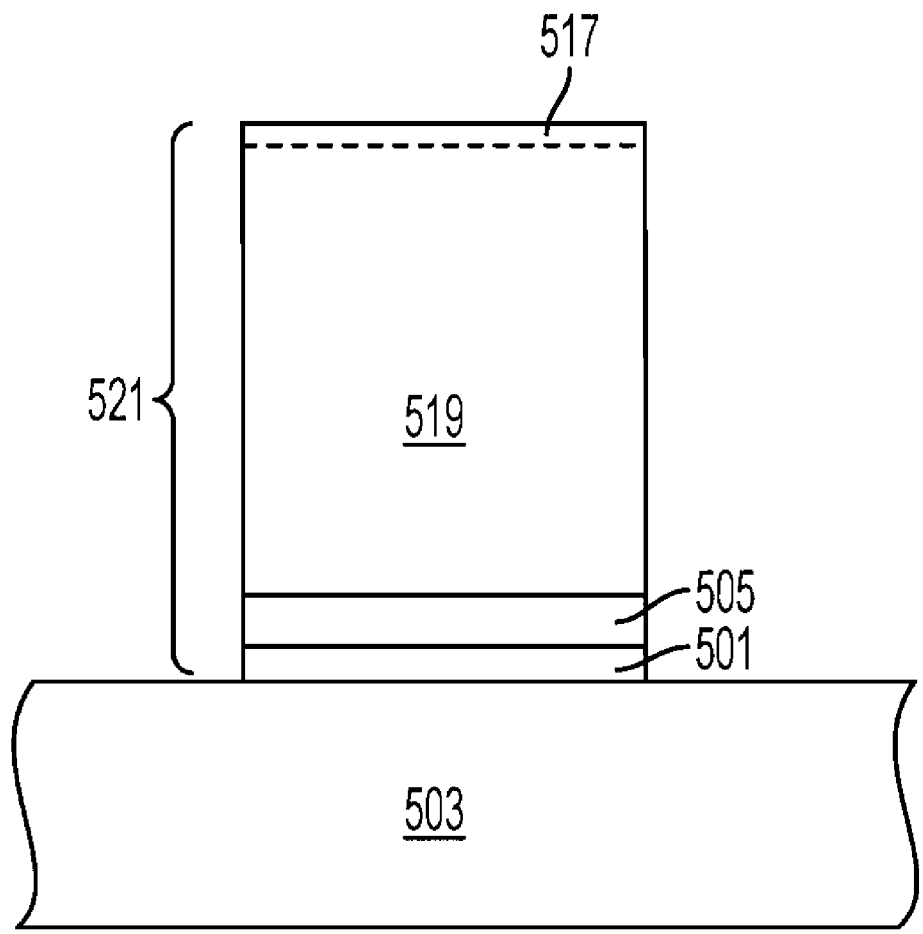

Silicon layer 507, metal layer 505, and high dielectric layer 501 are then etched to form a gate stack as illustrated in FIG. 5D, and similar to that illustrated in FIGS. 3C and 4D, having a substantially straight edge profile.

Figure 5E:
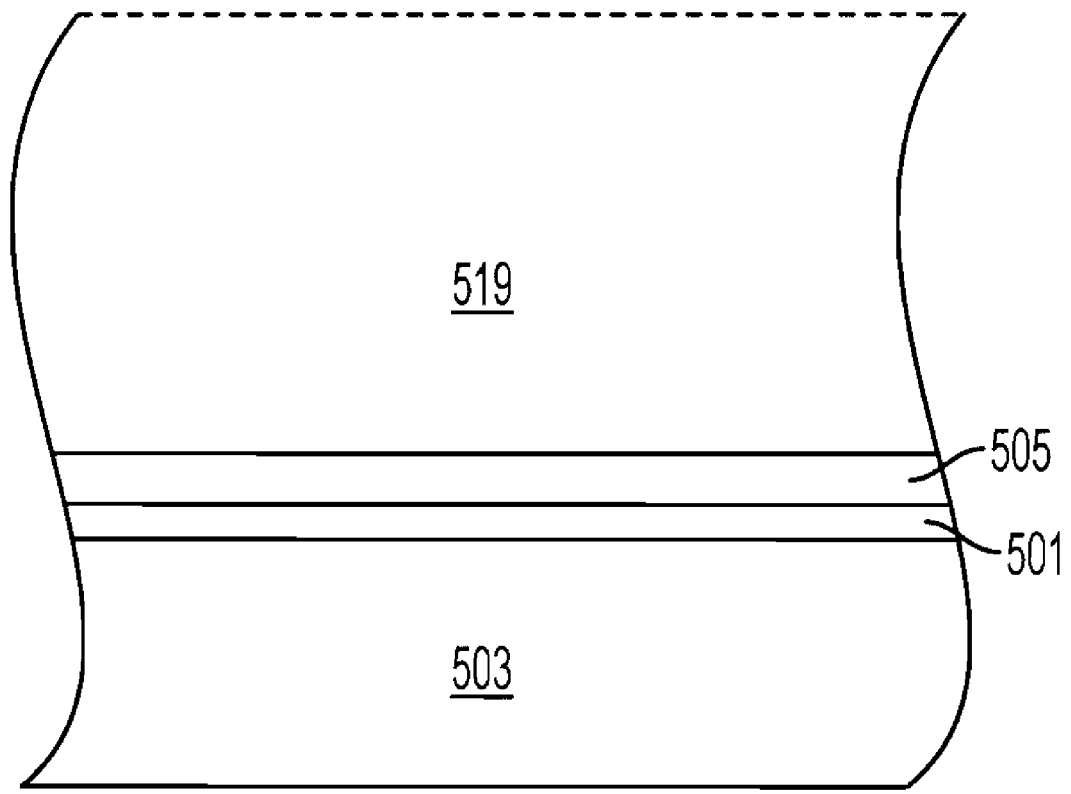
Figure 5F:
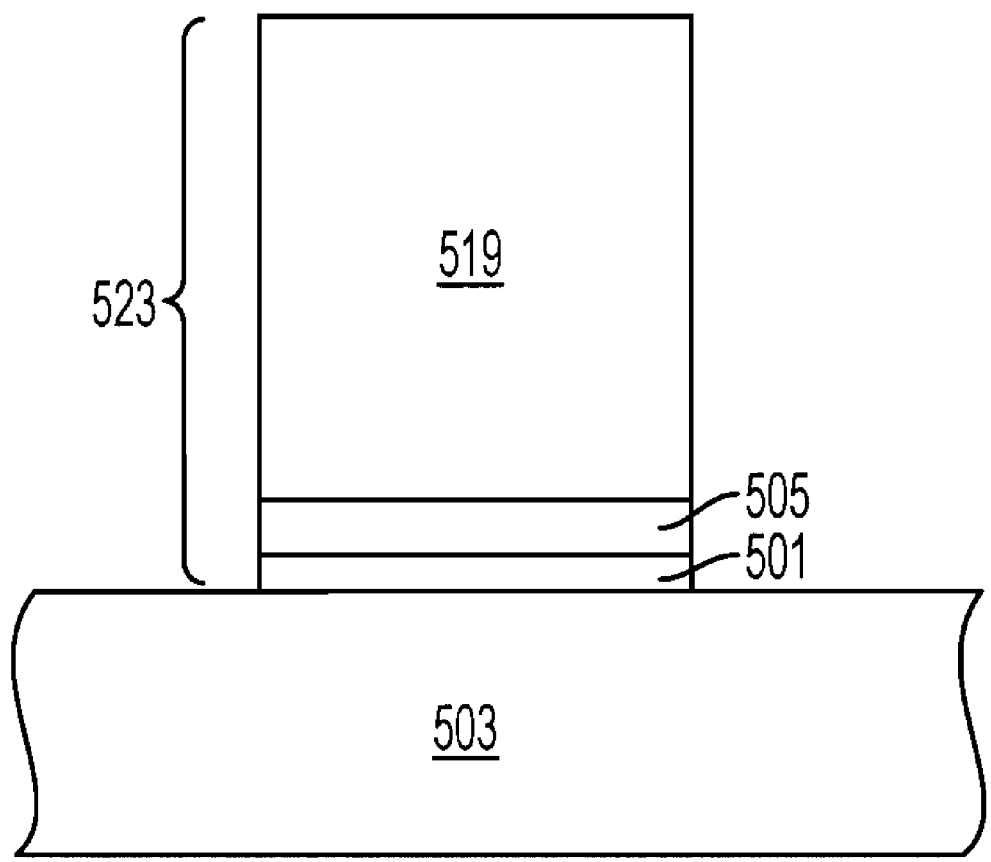

Alternatively, as illustrated in FIG. 5E, skin layer 517 may be removed before etching to form the gate stack. Removal of layer 517 may be accomplished by chemical mechanical planarization (CMP), wet etching, or reactive ion etching. Then the remaining layers, silicon layer 519, metal layer 505, and high dielectric layer 501 may be etched to form gate stack 523, as illustrated in FIG. 5F, having a substantially straight edge profile.

Embodiments of the present disclosure achieve several technical effects, including a straight gate profile, better threshold voltage control, improved transistor and circuit performance, and reduced defects during encapsulation. The present disclosure enjoys industrial applicability in fabricating any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a metal gate layer;
   a silicon layer, having an upper and a lower surface, on the metal gate layer, the silicon layer containing:
   a dopant having a high dopant concentration region at the upper surface of the silicon layer, wherein the high dopant concentration region has a dopant concentration greater than that of the remainder of the silicon layer; and
   a counter-dopant, in the high dopant concentration region, having a concentration substantially equal to a difference between the high dopant concentration and a dopant concentration near the lower surface of the silicon layer.

2. The device according to claim 1, further comprising a high-K dielectric layer, wherein the metal gate layer is on the high-K dielectric layer.

3. The device according to claim 2, wherein side surfaces of the silicon layer, metal gate layer, and high-K dielectric layer are substantially aligned.

4. The device according to claim 3, wherein the dopant comprises a p-type dopant, and the counter-dopant comprises an n-type dopant.

5. The device according to claim 4, wherein the dopant comprises boron (B), and the counter-dopant comprises phosphorus (P).

6. The device according to claim 5, wherein the silicon layer comprises polycrystalline silicon or amorphous silicon having a thickness of about 45 nm to about 65 nm.

7. The device according to claim 6, wherein the high dopant concentration region has a thickness of about 10 to about 15 nm and a dopant concentration of about 1E21 to about 1E22 atoms/cm$^3$.

8. A device comprising:
- a titanium nitride (TiN) metal gate layer having a thickness of about 2.5 to about 12 nanometers (nm);
- a silicon layer, having an upper and a lower surface, on the metal gate layer, the silicon layer having a thickness of about 45 nm to about 65 nm and containing:
  - a boron (B) dopant having a high dopant concentration region at the upper surface of the silicon layer, and a lower dopant concentration region at the lower surface of the silicon, wherein the high dopant concentration region has a thickness of about 10 to about 15 nm and a dopant concentration of about 1E21 to about 1E22 atoms/cm$^3$; and
- a phosphorus (P) counter-dopant, in the high dopant concentration region, having a concentration substantially equal to a difference between the high dopant concentration and the lower dopant concentration.

* * * * *